United States Patent [19]

Hook et al.

[11] Patent Number: 4,646,202
[45] Date of Patent: Feb. 24, 1987

[54] CABINET FOR ELECTRONIC APPARATUS

[75] Inventors: Sidney J. Hook, West Wittering; Philip Tittler; Gerald D. Walley, both of Preston, all of England

[73] Assignee: British Aerospace PLC, London, England

[21] Appl. No.: 861,747

[22] Filed: May 9, 1986

Related U.S. Application Data

[62] Division of Ser. No. 667,257, Nov. 1, 1984, abandoned.

[30] Foreign Application Priority Data

Nov. 2, 1983 [GB] United Kingdom ............... 8329269

[51] Int. Cl.[4] ............................................. H05K 7/20
[52] U.S. Cl. ................................. 361/382; 361/385; 165/80.3; 165/80.4
[58] Field of Search .............. 211/41; 361/381–388, 361/415; 174/16 R, 15 R; 165/80 A, 80 B, 80 C, 80 D, 80.2, 80.3, 80.4, 104.33; 339/17 L, 17 LC, 17 LM, 17 M, 112 R

[56] References Cited

U.S. PATENT DOCUMENTS

| 3,550,681 | 12/1970 | Stier | 165/80 B |
| 4,214,292 | 7/1980 | Johnson | 361/415 |
| 4,315,300 | 2/1982 | Parmelee | 361/384 |
| 4,498,119 | 2/1985 | Cronin | 361/386 |
| 4,517,625 | 5/1985 | Frink | 361/415 |

Primary Examiner—G. P. Tolin
Attorney, Agent, or Firm—Cushman, Darby & Cushman

[57] ABSTRACT

A cabinet (1) for stowage of electronic printed circuit boards (2,3,4) for example, is adapted for permanent installation in a vehicle structure by allowing the boards to be readily removable. The cabinet can thus be readily cooled by both air and fluid jackets (10,13, and 13,12) which are permanently connected to different sources of cooling flow.

10 Claims, 9 Drawing Figures

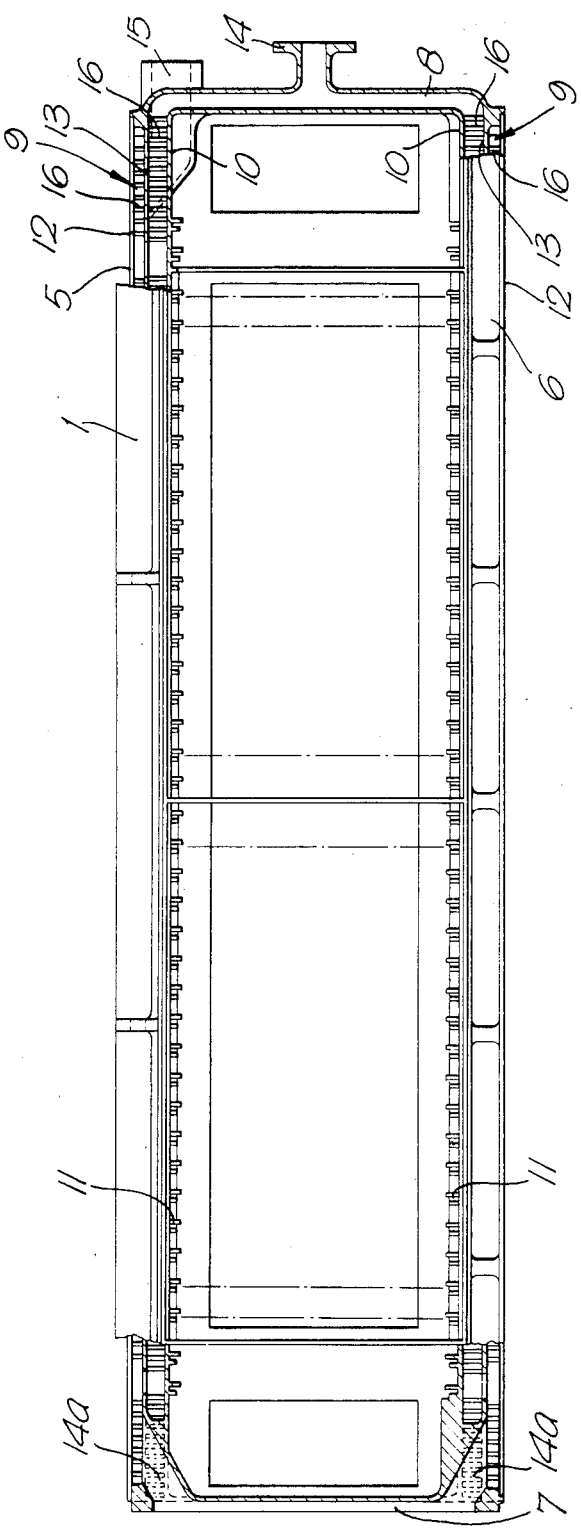

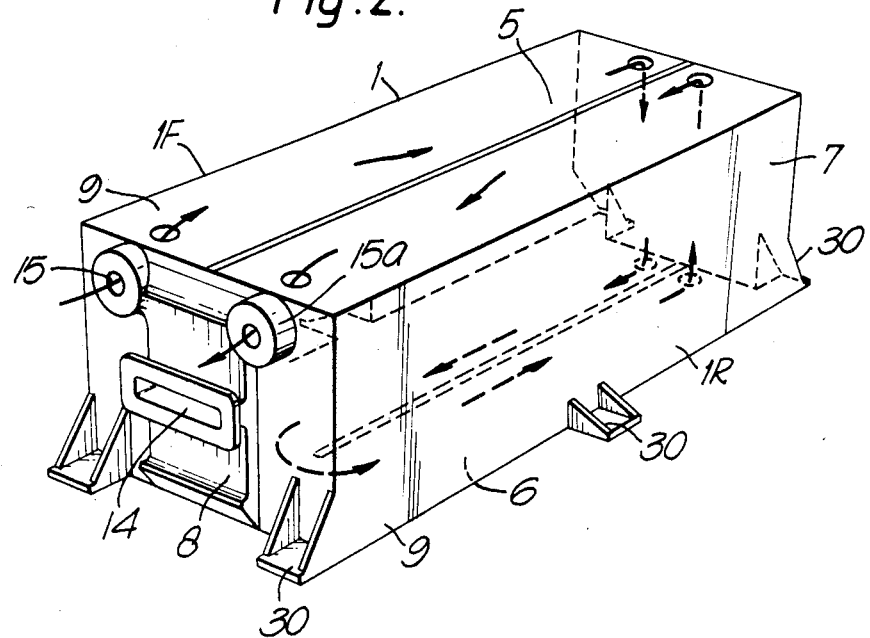
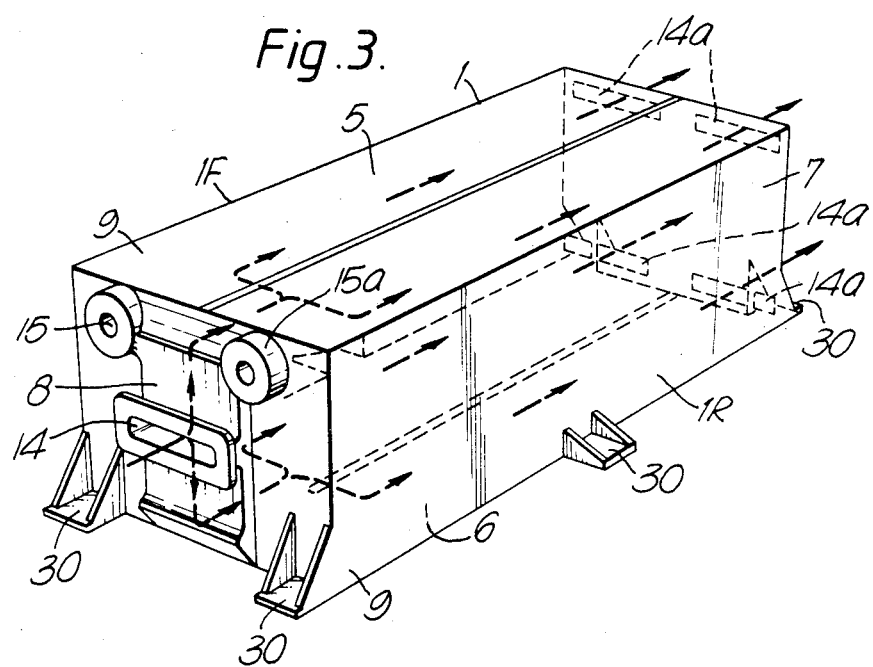

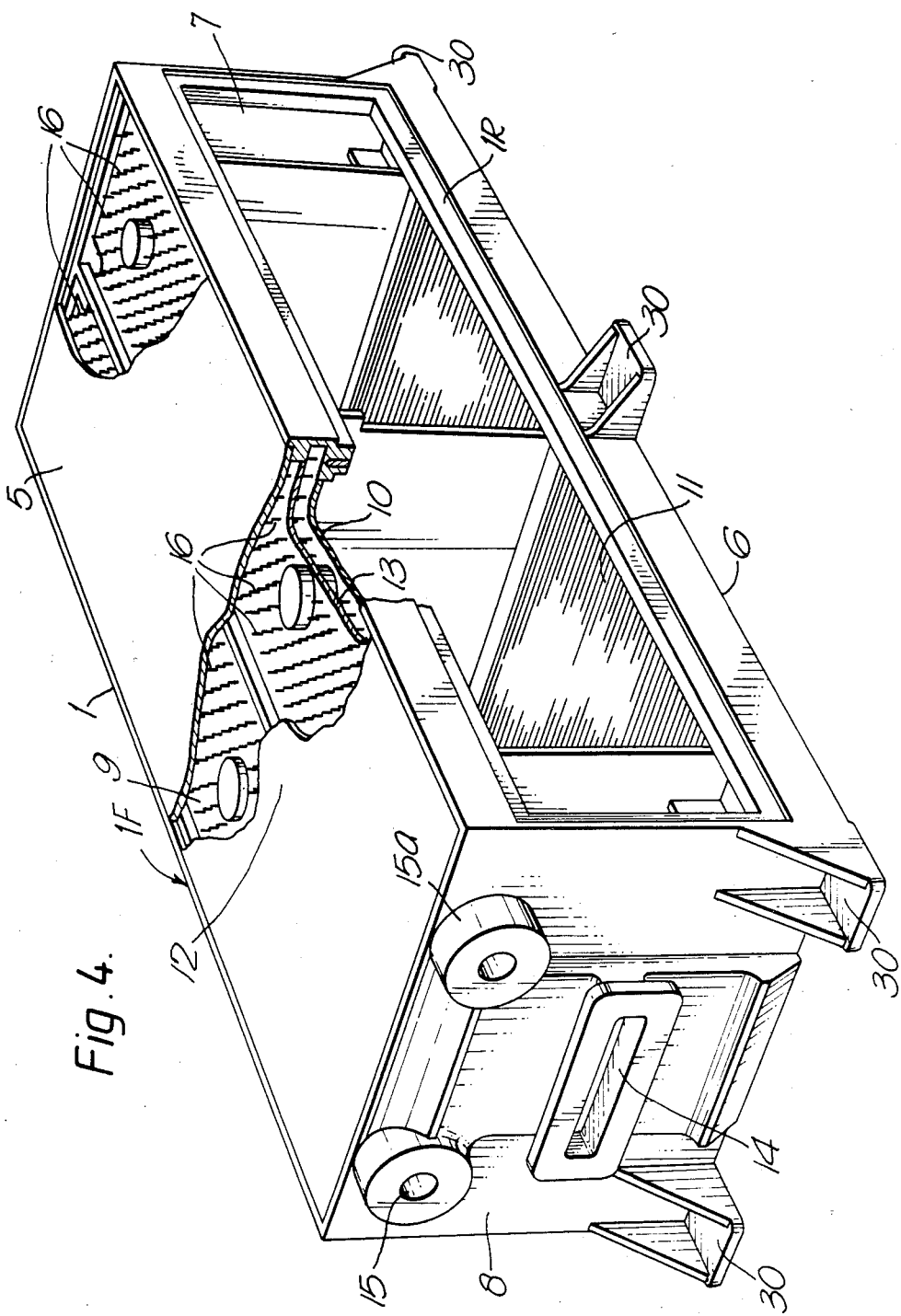

CABINET FOR ELECTRONIC APPARATUS

This is a division of application Ser. No. 667,257, filed Nov. 1, 1984, which was abandoned upon the filing hereof.

This invention relates to the stowage of electronic apparatus in the form of board members, that is to say circuit boards, cards, or other more bulky units.

Hitherto, such board members have been mounted in boxes or like containers, which have been bodily removable, e.g. for maintenance purposes, from the structure in which they were housed.

This bodily removable facility has caused problems in three major areas
  (a) cooling.
  (b) reliability.
  (c) logistics.

Dealing briefly with each in turn, the problem of cooling becomes acute when more apparatus is squeezed into a given volume and particularly when that apparatus, as technology advances, requires to dissipate an increasing amount of heat. Hitherto, to avoid problems of leakage and bulk associated with hose connectors and the hoses themselves, the removable boxes tended to be air cooled. Liquid cooling is now preferred. But to retain the bodily removable facility and have a convenient liquid cooling arrangement is shown to be difficult; the two features are incompatible.

The problem of reliability is exacerbated by the number of electrical connections required to enable the removable facility to be retained. Many connectors are necessary which, as is the case with hose connectors, on removal of a box, require to be broken, and on replacement of the box, require to be reassembled.

Finally, the logistic problem is caused by the necessity of an operator maintaining a store of spare boxes, so that when a faulty box is removed, it can be immediately replaced with a fresh one.

From the above discussion, it can be seen that an object of the present invention is to provide stowage means for electronic apparatus (for example, cards or units) which can be left permanently in a structure.

As a corollary to this, it is an objective to provide stowage means adapted for liquid cooling, to provide means for enabling individual board members to be removed in an easy fashion for maintenance purposes, and to provide means for ensuring that they are in good electrical and thermal connection with other equipment and the stowage means when in use.

According to the present invention, stowage means for electronic apparatus, suitable for permanent mounting in a structure, includes parallel spaced side walls and parallel spaced end walls forming an open mouthed cabinet, a plurality of board members carrying electronic apparatus having spaced edge regions adapted for thermal conduction, guide means extending transversely across the spaced side walls for slidably accepting and locating the edge regions when the board members are inserted through the mouth region, and effecting a good thermal path between the board members and the side walls of the cabinet, first shroud means providing a first fluid cavity between it and the side walls, the first shroud means having inlet and outlet means for allowing a first fluid to flow through the first fluid cavity for cooling purposes, second shroud means providing a second fluid cavity between it and the second shroud means, the second shroud means having inlet and outlet means allowing a second fluid to flow through the second cavity for cooling purposes.

An example of stowage means according to the invention is described by way of examples with reference to the accompanying Figures in which:

FIG. 1 is a partially sectioned front elevation of a cabinet,

FIG. 2 is a perspective view of a cabinet illustrating liquid coolant flow,

FIG. 3 is a similar view to that of FIG. 2, illustrating gaseous coolant flow,

FIG. 4 is a perspective view of the cabinet partially cut away for clarity,

Figure 5:
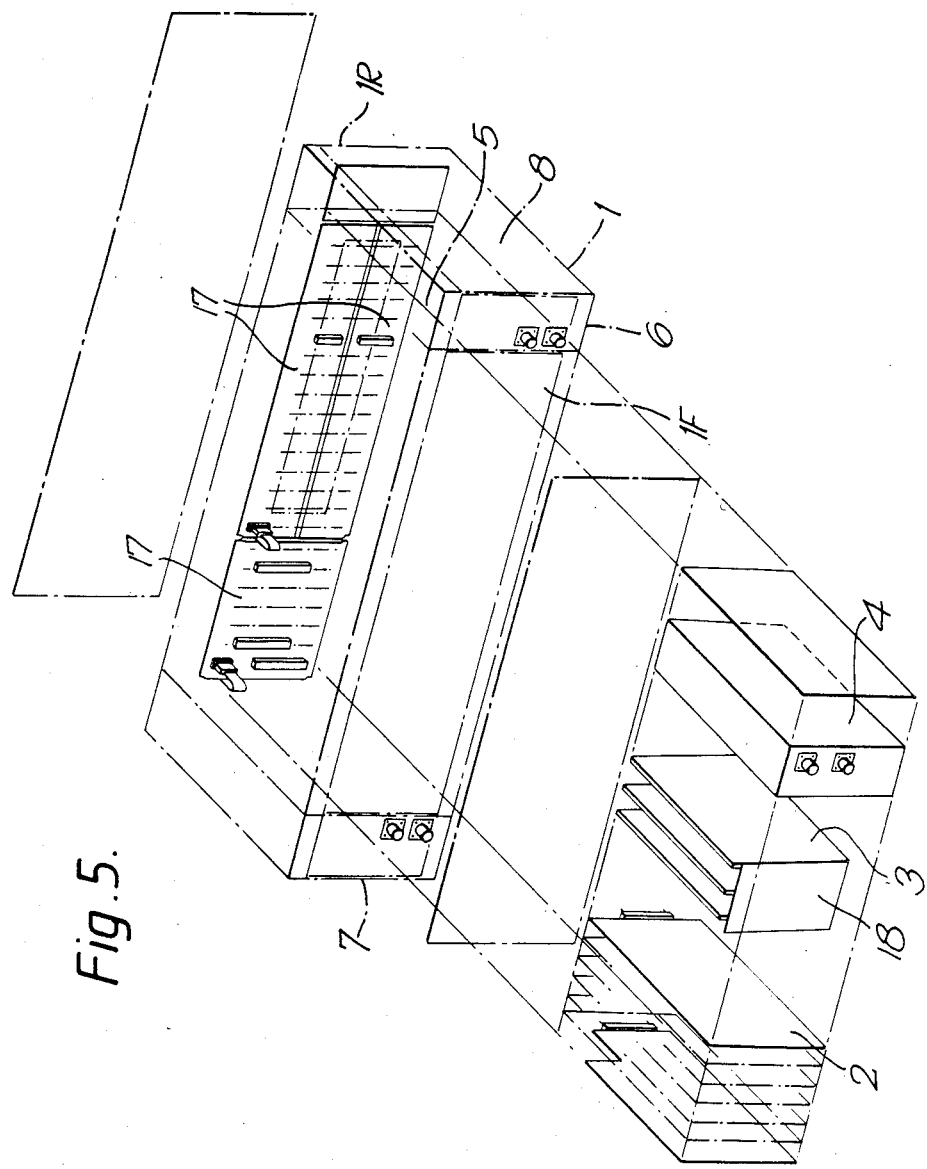
FIG. 5 is an isometric view of the cabinet outline with board members carrying electronic apparatus shown ready for insertion.

A cabinet or box 1 for electronic apparatus, such as individual circuit boards or cards 2, group circuit boards or cards 3, and units 4, is adapted by means of lugs shown typically at 30, for permanent mounting within a supporting structure, not shown. The structure may be racking in a fixed assembly, or it may be the hull of a vehicle. The embodiments described are particularly, although not exclusively, for aircraft, where compactness, reliability and also rapidity of maintenance away from home base are prerequisites.

The box 1 includes, as drawn, an upper member 5, a lower member 6 and edge members 7 and 8 respectively, which combine to provide a box carcase with rear region 1R and front region 1F. The upper and lower members 5 and 6 are each formed with heat exchangers 9 extending over at least a large proportion of their area. Each heat exchanger 9 comprises twin fluid sealed jackets or cavities formed by an inner wall 10 (in other words side walls) directed towards the interior of the box and which therefore conveniently carries guideways 11, whose function will be later described, an outer wall 12 (in other words the second shroud means) which also serves to aid permanent mounting of the box in a supporting structure, not shown, and an intermediate wall 13 (in other words the first shroud means) lying spaced from the inner and outer walls.

The inner wall and the intermediate wall define an air jacket (in other words the first cavity) through which cooling air is ducted through an inlet 14 adapted for permanent flow connection to an air cooling system housed in the supporting structure. The outer wall and the intermediate wall define a liquid jacket (in other words the second cavity) through which cooling liquid is ducted through an inlet 15 also adapted for permanent flow connection to a liquid cooling system housed in the supporting structure. The walls have extending between them a multiplicity of rod-like elements 16 (in other words thermal conduction means) which provide an adequate thermal path from the inner wall and the necessary heat exchange surface area. Moreover, the rods provide structural stabilisation of the walls.

The liquid flow is the primary cooling medium, the air flow being used as a secondary or standby medium. The cooling air may be dumped after serving its cooling purpose and outlets are provided at 14a. Naturally, the liquid is recycled and for this purpose a coolant outlet is provided at 15a.

Since the box 1 is adapted to be permanently mounted, its contents must be readily removable and replaceable for maintenance purpose. Thus, a store of replacement boxes is unnecessary. Not only must the contents be readily removed, they must be readily interconnected one with another, and with the contents of other boxes. They must also, in use, be in good thermal contact with the upper member 5 and the lower member 6 of the box.

To provide reliable interconnection with as few breakable (e.g. plug and socket) connections as possible, the box is provided with pre-wired pluggable back plates 17. These are mounted in the rear region 1R of the box providing in effect a rear face. They are removable from the front 1F of the box. The back plates 17 carry supply circuits, both normal and emergency, and data bus means in, for example, parallel. These back plates may carry electronic components which perform a management function, i.e. load shedding, communication protocol and the like.

As is illustrated, the cards 2, groups of cards 3, and units 4 are all readily pluggable into the back plates 17 when guided by the guides 11.

The groups of cards 3 each form a sub-system and are conveniently interconnected by a fore plate 18.

Naturally, to effect adequate cooling, the cards 2, the groups of cards 3, and the units must be designed to allow heat flow to those edges adjacent the upper and lower members, and as previously discussed the guides 11 must be so fashioned as to promote good thermal conduction between those edges and the upper and lower members.

Figure 6:
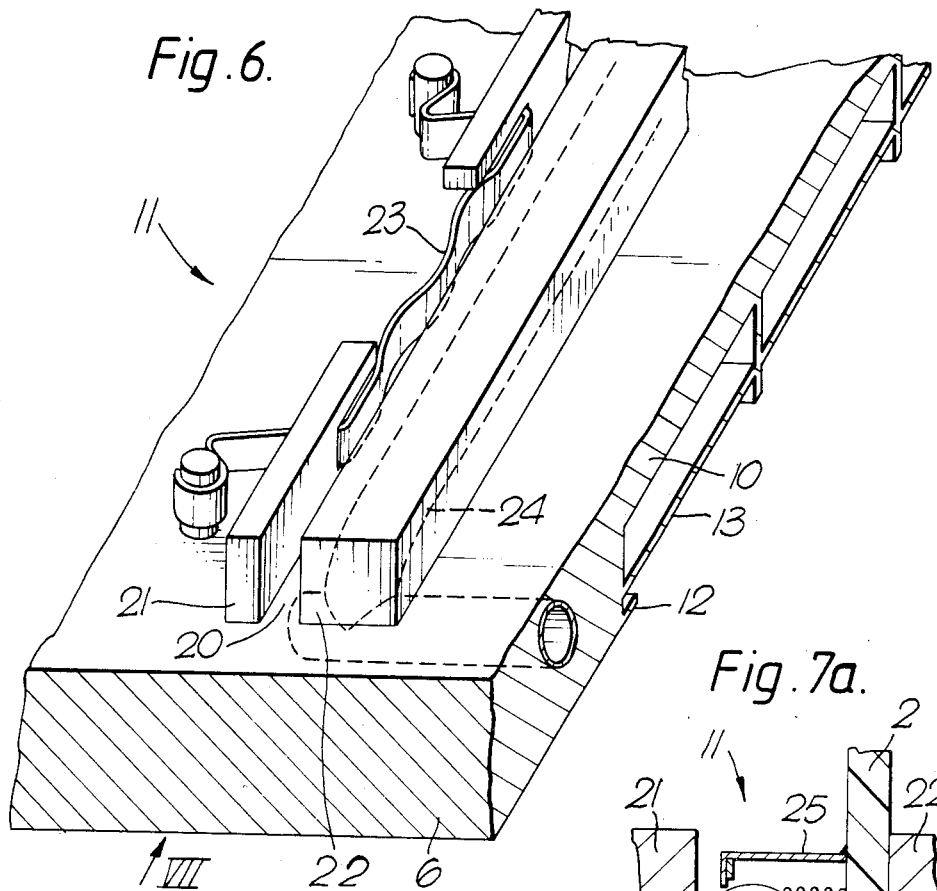
FIG. 6 is an isometric view of a board guiding and location arrangement, and FIGS. 7a, b and c illustrate an alternative board guiding and location arrangement.

FIG. 6 illustrates guides designed for this purpose.

A slot 20 to accept a card 2 is provided between twin guides 21 and 22 carried by the member 5 or the member 6 of the box. The guide 21 has associated with it an elongate spring 23 anchored at its end around pins to bias an inserted card towards the guide 22. Means, not shown, are provided to release the bias of the spring to allow easy insertion and removal of the card. The guide 22 has a cooling duct 24 included therein and in communication with either the liquid or the air cooling systems, so that provided a card is in intimate contact with that guide, (as biased by the spring 23) a good thermal path is ensured.

Figure 7A:
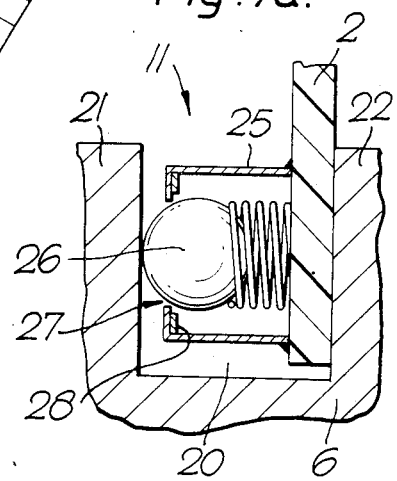
Figure 7B:
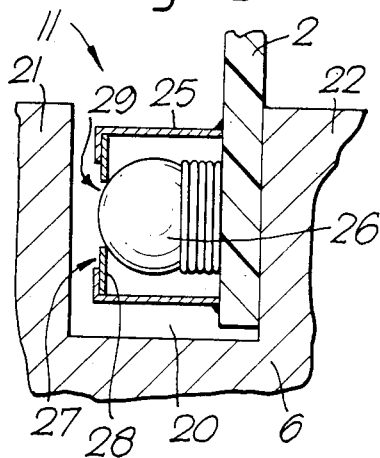
Figure 7C:
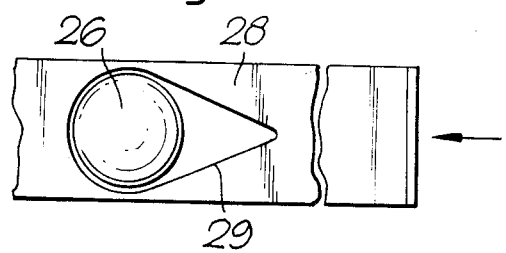

An alternative to the spring 23 is disclosed in FIGS. 7a, b, c. In these FIGS. 7a and 7b are views on Arrow VII of FIG. 6, and FIG. 7c is a side view of FIGS. 7a and 7b. In this embodiment, similar guides 21 and 22 are provided but that referenced 21 requires no aperture for the spring 23, and naturally both may be cooled after the fashion of that referenced 22.

In this arrangement, a card 2 is provided top and bottom with side biasing assemblies, each assembly having an elongate housing 25 extending the width of the card, a spring or resiliently biased ball 26 housed within the housing and allowed to protrude through an aperture 27 so that the ball can bear against the guide 21 and urge the card 2 against the guide 22. Within the housing adjacent the aperture 27 is provided a slide plate 28 which is capable of being moved to and fro within the housing, that is to say from the front to the back of the card and vice versa. One end of the plate 28 may project through an appropriate slot out of the housing 25 for manual movement of the plate. The plate 28 is provided with a tapered aperture 29 the larger end of which is the same size as and is normally aligned wih the aperture 27, but when the card is to be inserted or extracted, by appropriate movement of the slider plate 28 to move the smaller end of the aperture 29 toward the aperture 27, as shown by the arrow in FIG. 7c, the ball is urged away from contact with the guide 21. In other words, the ball is retracted into the housing 25.

What is claimed is:

1. A cabinet for electronic apparatus mounted on a plurality of board members having spaced edge regions adapted for thermal conduction, said cabinet being suitable for permanent mounting in a structure, and comprising:

parallel spaced side walls and parallel spaced end walls forming an open mouthed cabinet;

guide means extending transversely across the inner sides of said spaced side walls for slidably receiving and locating the edge regions of the board members when the latter are inserted through the open mouth of said cabinet, said guide means effecting a good thermal path between said side walls and the board members;

intermediate wall means providing a first fluid cavity between it and said side walls, said intermediate wall means having inlet and outlet means for allowing a first fluid to flow through said first cavity for cooling purposes; and outer wall means providing a second fluid cavity between it and said intermediate wall means, said outer wall means having an inlet and outlet means for allowing a second fluid to flow through said second cavity for cooling purposes.

2. A cabinet according to claim 1 including thermal conduction means provided between the side walls and the intermediate wall means.

3. A cabinet according to claim 2 including thermal conduction means provided between the intermediate wall means and the outer wall means.

4. A cabinet according to claim 1 including the first and second fluids flowing through the first and second cavities, respectively, and wherein one of said fluids is a gas and the other is a liquid.

5. A cabinet according to claim 1 in which the guide means includes means for biasing the edge regions of the boards against one side of the guide means to effect good thermal contact therebetween.

6. A cabinet according to claim 1 including board members having means on their spaced edge regions for biasing the same against one side of the guide means to effect good thermal contact therebetween.

7. A cabinet according to claim 1 including a back plate member insertable through the open mouth of said cabinet to be located transverse to the guide means, and hence the board members received in said guide means, in that region of said cabinet remote from said open mouth, and connecting means carried on said back plate member for effecting electrical interconnection with complementary connecting means on the board members.

8. A cabinet according to claim 7 including a fore plate member located transversely of the guide means, and hence the board members, in the mouth region of said cabinet, and connecting means carried by said fore plate for effecting electrical connection with complementary connecting means on the board members.

9. A cabinet according to claim 4 wherein the first fluid is a gas.

10. A cabinet according to claim 1 wherein the guide means include fluid ducts whereby heat transfer from the board members is facilitated.

* * * * *